United States Patent
Jeddeloh et al.

(10) Patent No.: US 10,037,818 B2
(45) Date of Patent: *Jul. 31, 2018

(54) SWITCHED INTERFACE STACKED-DIE MEMORY ARCHITECTURE

(71) Applicant: Micron Technology, Inc., Boise, ID (US)

(72) Inventors: Joe M. Jeddeloh, Shoreview, MN (US); Paul A. LaBerge, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/849,331

(22) Filed: Dec. 20, 2017

(65) Prior Publication Data

US 2018/0114587 A1  Apr. 26, 2018

Related U.S. Application Data

(60) Continuation of application No. 15/155,848, filed on May 16, 2016, now Pat. No. 9,875,814, which is a
(Continued)

(51) Int. Cl.
*G11C 29/00* (2006.01)
*G11C 7/10* (2006.01)
(Continued)

(52) U.S. Cl.
CPC .......... *G11C 29/76* (2013.01); *G06F 13/1668* (2013.01); *G06F 13/4239* (2013.01);
(Continued)

(58) Field of Classification Search
CPC ... G11C 29/785; G11C 29/787; G11C 29/789; G11C 29/838; G11C 29/886
See application file for complete search history.

(56) References Cited

U.S. PATENT DOCUMENTS

4,807,191 A    2/1989  Flannagan
6,633,504 B1  10/2003  Lee et al.
(Continued)

FOREIGN PATENT DOCUMENTS

CN    1767054 A    5/2006
CN    1832165 A    9/2006
(Continued)

OTHER PUBLICATIONS

"Chinese Application Serial No. 200980148540.1 Response filed Dec. 23, 2014 to Non-Final Office Action dated Sep. 25, 2014", With the English claims, 12 pgs.
(Continued)

*Primary Examiner* — Andrew Q Tran
(74) *Attorney, Agent, or Firm* — Schwegman Lundberg & Woessner, P.A.

(57) ABSTRACT

Systems and methods disclosed herein include those that may receive a memory request including a requested memory address and may send the memory request directly to an address decoder associated with a stacked-die memory vault without knowing whether a repair address is required. If a subsequent analysis of the memory request shows that a repair address is required, an in-process decode of the requested memory address can be halted and decoding of the repair address initiated.

20 Claims, 11 Drawing Sheets

Related U.S. Application Data continuation of application No. 14/142,565, filed on Dec. 27, 2013, now Pat. No. 9,343,180, which is a division of application No. 13/595,294, filed on Aug. 27, 2012, now Pat. No. 8,619,481, which is a division of application No. 12/261,963, filed on Oct. 30, 2008, now Pat. No. 8,254,191.

(51) Int. Cl.

| | | |
|---|---|---|
| *G06F 13/16* | (2006.01) | |
| *G11C 29/04* | (2006.01) | |
| *G11C 5/02* | (2006.01) | |
| *G11C 8/10* | (2006.01) | |
| *G06F 13/42* | (2006.01) | |

(52) U.S. Cl.
CPC ............... *G11C 5/02* (2013.01); *G11C 7/10* (2013.01); *G11C 8/10* (2013.01); *G11C 29/04* (2013.01); *Y02B 70/123* (2013.01); *Y02B 70/126* (2013.01)

(56) References Cited

U.S. PATENT DOCUMENTS

| | | | |
|---|---|---|---|
| 7,218,559 B2 | 5/2007 | Satoh | |
| 7,404,117 B2 | 7/2008 | Ong et al. | |
| 7,440,309 B2 | 10/2008 | Hummler | |
| 7,855,931 B2 | 12/2010 | Laberge et al. | |
| 7,898,893 B2 | 3/2011 | Park et al. | |
| 7,924,639 B2 | 4/2011 | Park et al. | |
| 7,978,721 B2 | 7/2011 | Jeddeloh et al. | |
| 8,217,710 B2 | 7/2012 | Bae | |
| 8,254,191 B2 | 8/2012 | Jeddeloh et al. | |
| 8,619,481 B2 | 12/2013 | Jeddeloh et al. | |
| 9,343,180 B2 | 5/2016 | Jeddeloh et al. | |
| 9,472,305 B2 | 10/2016 | Choo et al. | |
| 9,875,814 B2 * | 1/2018 | Jeddeloh | G11C 29/76 |
| 2007/0033385 A1 | 2/2007 | Smaus et al. | |
| 2007/0191557 A1 | 8/2007 | Kattenberg | |
| 2007/0291557 A1 | 12/2007 | Nishio et al. | |
| 2008/0101104 A1 | 5/2008 | Ikeda | |
| 2008/0198646 A1 | 8/2008 | Park et al. | |
| 2010/0110745 A1 | 5/2010 | Jeddeloh et al. | |
| 2011/0264858 A1 | 10/2011 | Jeddeloh et al. | |
| 2012/0320688 A1 | 12/2012 | Jeddeloh et al. | |
| 2014/0112085 A1 | 4/2014 | Jeddeloh et al. | |
| 2016/0260503 A1 | 9/2016 | Jeddeloh et al. | |

FOREIGN PATENT DOCUMENTS

| | | |
|---|---|---|
| CN | 100538883 C | 9/2009 |
| CN | 104778136 A | 7/2015 |
| EP | 1345125 A2 | 9/2003 |
| JP | 1196081 A | 4/1999 |
| JP | 2006073181 A | 3/2006 |
| JP | 2008112503 A | 5/2008 |
| JP | 2008299997 A | 12/2008 |
| JP | 2012505491 A | 3/2012 |
| TW | 498325 B | 8/2002 |
| TW | 525180 B | 3/2003 |
| TW | 200715296 A | 4/2007 |
| TW | I525446 B | 3/2016 |
| WO | WO-2010059380 A1 | 5/2010 |

OTHER PUBLICATIONS

"Chinese Application Serial No. 200980148540.1, Office Action dated Mar. 5, 2014", W/ English Translation, 15 pgs.
"Chinese Application Serial No. 200980148540.1, Office Action dated May 15, 2013", W/ English Translation, 20 pgs.
"Chinese Application Serial No. 200980148540.1, Office Action dated Aug. 8, 2014", W/ English Tanslation, 17 pgs.
"Chinese Application Serial No. 200980148540.1, Response filed Nov. 28, 2013 to Office Action dated May 15, 2013", W/ English Claims, 12 pgs.
"Chinese Application Serial No. 201510136877.8, Office Action dated Jun. 1, 2017", No English translation, 5 pgs.
"Chinese Application Serial No. 201510136877.8, Office Action dated Sep. 20, 17", W/ English Translation, 5 pgs.
"Chinese Application Serial No. 201510136877.8, Response filed Aug. 4, 2017 to Office Action dated Jun. 1, 2017", No English translation, 6 pgs.
"European Application Serial No. 09827978.9, Extended European Search Report dated May 2, 2013", 6 pgs.
"European Application Serial No. 09827978.9, Response filed Nov. 26, 2013 to Extended European Search Report dated May 2, 2013", 19 pgs.
"International Application Serial No. PCT/US2009/062595, Search Report dated Jan. 29, 2010", 3 pgs.
"International Application Serial No. PCT/US2009/062595, Written Opinion dated Jan. 29, 2010", 4 pgs.
"Japanese Application Serial No. 2011-534773, Office Action dated Mar. 11, 2014", 3 pgs.
"Japanese Application Serial No. 2011-534773, Office Action dated Jul. 30, 2013", 5 pgs.
"Japanese Application Serial No. 2011-534773, Response filed Dec. 25, 2013 to Office Action dated Jul. 30, 2013", 5 pgs.
"Japanese Application Serial No. 2014-155396, Office Action dated Jun. 23, 2015", 6 pgs.
"Korean Application Serial No. 10-2011-7011889, Office Action dated Nov. 20, 2014", W/ English Translation, 5 pgs.
"Taiwanese Application Serial No. 098136343, Office Action dated Jun. 16, 2015", 5 pgs.
U.S. Appl. No. 15/155,848, filed May 16, 2016, Switched Interface Stacked-Die Memory Architecture.
"Chinese Application Serial No. 201510136877.8, Response filed Nov. 27, 2017 to Office Action dated Sep. 20, 2017", w/ Amended Claims, 9 pgs.

* cited by examiner

SWITCHED INTERFACE STACKED-DIE MEMORY ARCHITECTURE

PRIORITY APPLICATION

This application is a continuation of U.S. application Ser. No. 15/155,848, filed May 16, 2016, which is a continuation of U.S. application Ser. No. 14/142,565, filed Dec. 27, 2013, now issued as U.S. Pat. No. 9,343,180, which is a divisional of U.S. application Ser. No. 13/595,294, filed Aug. 27, 2012, now issued as U.S. Pat. No. 8,619,481, which is a divisional of U.S. application Ser. No. 12/261,963, filed Oct. 30, 2008, now issued as U.S. Pat. No. 8,254,191, all of which are incorporated herein by reference in their entirety.

TECHNICAL FIELD

Various embodiments described herein relate to apparatus, systems, and methods associated with semiconductor memories, including switched interface stacked-die memory architectures.

BACKGROUND INFORMATION

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clocks waiting for responses to memory requests.

In addition, the evolution of software application and operating system technology has increased demand for higher-density memory subsystems as the number of processor cores and threads continues to increase. However, current-technology memory subsystems often represent a compromise between performance and density. Higher bandwidths may limit the number of memory cards or modules that may be connected in a system without exceeding JEDEC electrical specifications.

Extensions to the JEDEC interface have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

Figure 1:
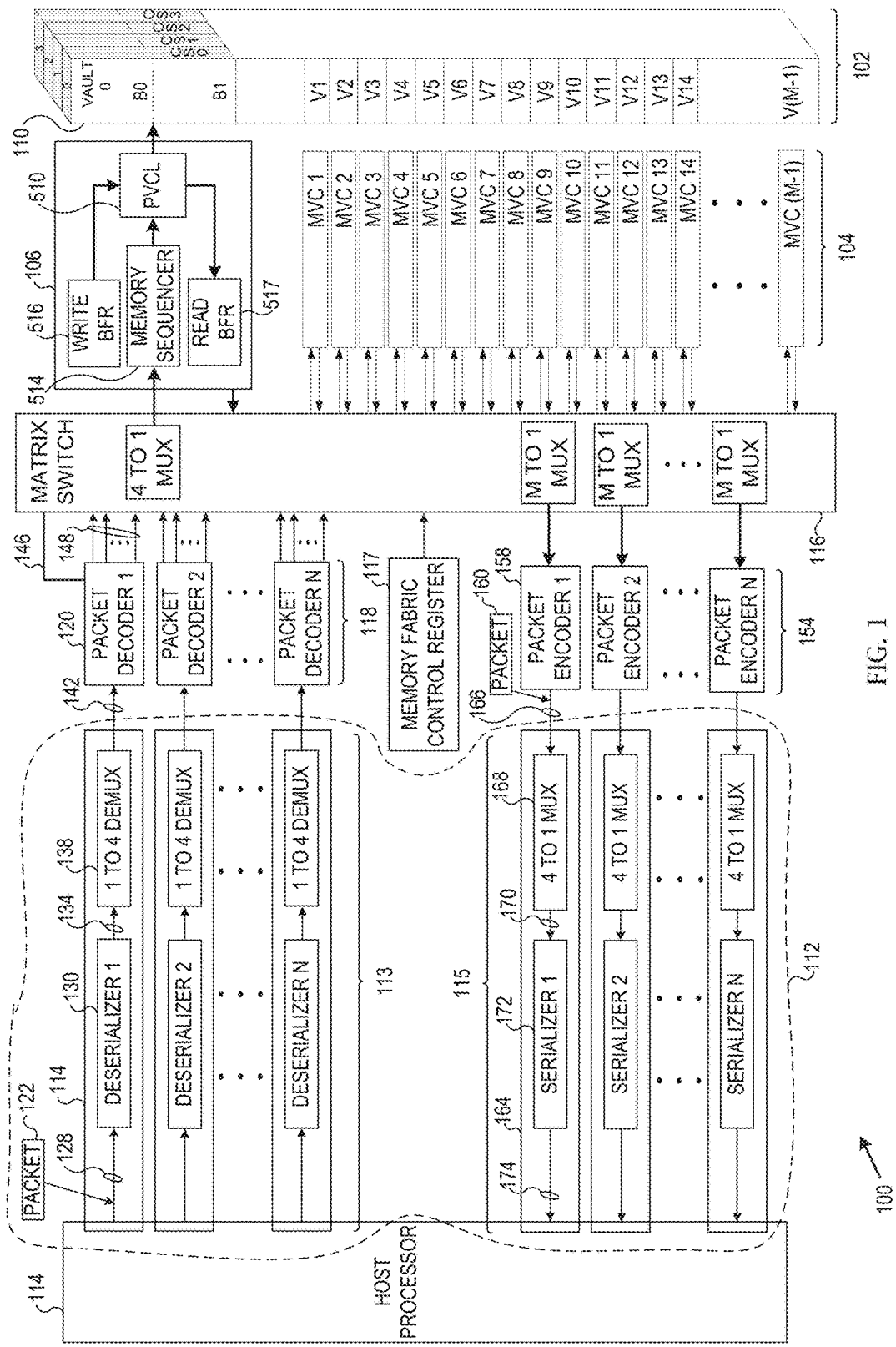
FIG. 1 is a block diagram of a memory system according to various example embodiments of the current invention.

FIG. 1 is a block diagram of a memory system 100 according to various example embodiments of the current invention. One or more embodiments operate to substantially concurrently transfer a plurality of outbound streams of commands, addresses, and/or data between one or more originating devices (e.g., one or more processors) and a set of stacked-array memory "vaults." Increased memory system density, bandwidth, parallelism, and scalability may result.

Multi-die memory array embodiments herein aggregate control logic that is normally located on each individual memory array die in previous designs. Subsections of a stacked group of dies, referred to herein as a "memory vault," share common control logic. The memory vault architecture strategically partitions memory control logic to increase energy efficiency while providing a finer granularity of powered-on memory banks. Embodiments herein also enable a standardized host processor to memory system interface. The standardized interface may reduce re-design cycle times as memory technology evolves.

Figure 2:
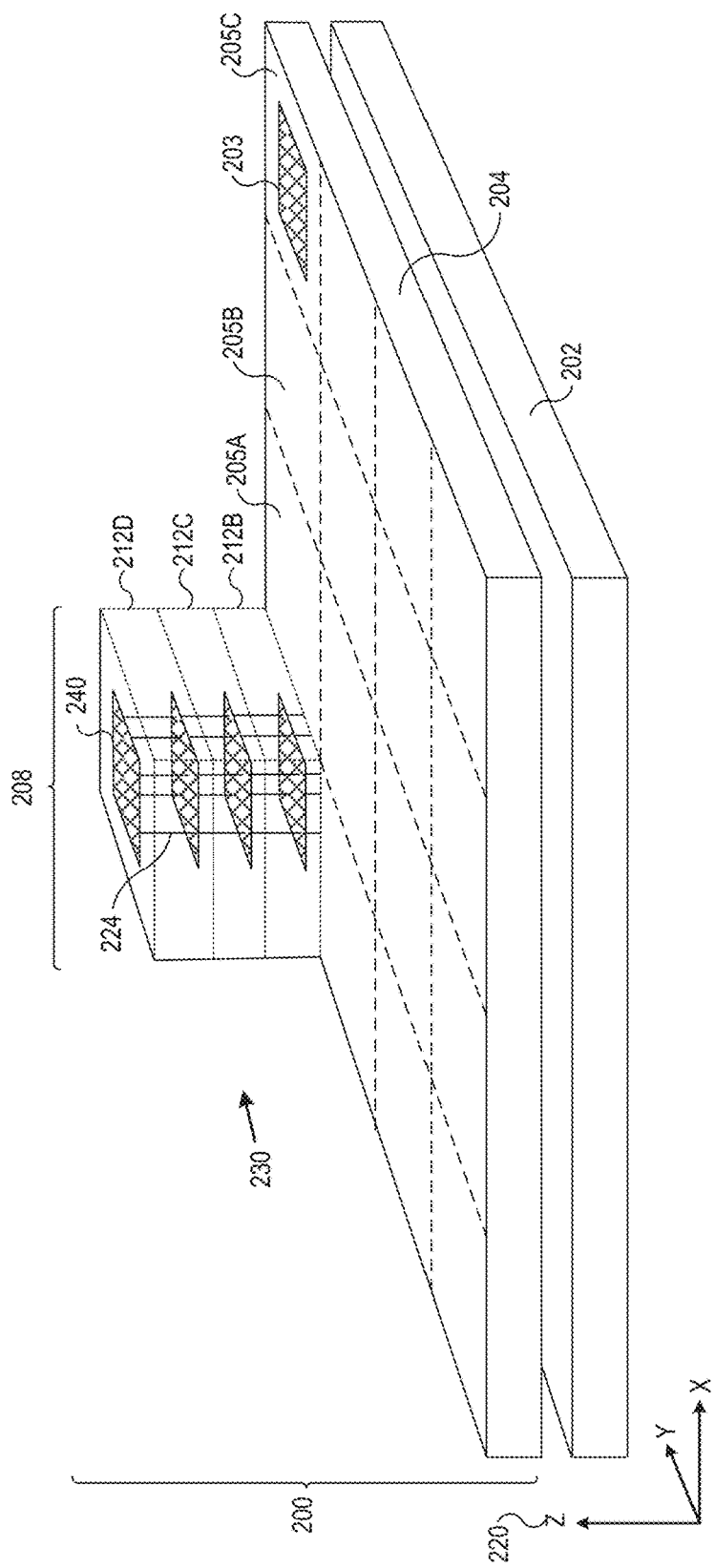
FIG. 2 is a cut-away conceptual view of a stacked-die 3D memory array stacked with a logic die according to various example embodiments.

FIG. 2 is a cut-away conceptual view of a stacked-die 3D memory array 200 stacked with a logic die 202 according to various example embodiments. The memory system 100 incorporates one or more stacks of tiled memory arrays such as the stacked-die 3D memory array 200. Multiple memory arrays (e.g., the memory array 203) are fabricated onto each of a plurality of stacked dies (e.g., the stacked die 204).

Each of the stacked dies is logically divided into multiple "tiles" (e.g., the tiles 205A, 205B, and 205C associated with the stacked die 204). Each tile (e.g., the tile 205C) may include one or more memory arrays 203. In some embodiments, each memory array 203 may be configured as one or more independent memory banks in the memory system 100. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224) referred to herein as "through-wafer interconnects" (TWIs). The stacked-die 3D memory array 200 is thus partitioned into a set of memory "vaults" (e.g., the memory vault 230). Each memory vault includes a stacked set of tiles, one tile from each of a plurality of stacked dies. Each tile of the vault includes one or more memory arrays (e.g., the memory array 240).

The resulting set of memory vaults 102 is shown in FIG. 1. Control, switching, and communication logic described here below is fabricated onto the logic die 202. The memory system 100 includes a plurality of memory vault controllers (MVCs) 104 (e.g., the MVC 106). Each MVC is communicatively coupled to a corresponding memory vault (e.g., the memory vault 110) in a one-to-one relationship. Each MVC is thus capable of communicating with a corresponding memory vault independently from communications between other MVCs and their respective memory vaults.

In some embodiments, the memory vault 110 may be configured such that contiguous areas of defective memory cells on individual dies used to form the memory vault 110 do not overlap address-wise from die to die. The memory vault 110 may also be configured with a spare memory array die. A contiguous area of operational memory cells on the spare die may be located at a starting memory address including at least one of a bank address, a row address, or a column address in common with a contiguous area of operational memory cells on one or more of the other memory array dies used to form the vault 110. Such configuration may facilitate fast memory request redirection by requiring only a partial decode of a memory request address. A bad block map of defective memory cells associated with each of the memory array dies may be formed on the common logic die 202 stacked together with the stacked memory array dies 204.

The memory system 100 also includes a plurality of configurable serialized communication link interfaces (SCLIs) 112. The SCLIs 112 are divided into an outbound group of Sells 113 (e.g., the outbound SCLI 114) and an inbound group of SCLIs 115. Each of the plurality of Sells 112 is capable of concurrent operation with the other SCLIs 112. Together the SCLIs 112 communicatively couple the plurality of MVCs 104 to one or more host processor(s) 114. The memory system 100 presents a highly abstracted, multi-link, high-throughput interface to the host processor(s) 114.

The memory system 100 may also include a matrix switch 116. The matrix switch 116 is communicatively coupled to the plurality of SCLIs 112 and to the plurality of MVCs 104. The matrix switch 116 is capable of cross-connecting each SCLI to a selected MVC. The host processor(s) 114 may thus access the plurality of memory vaults 102 across the plurality of SCLIs 112 in a substantially simultaneous fashion. This architecture can provide the processor-to-memory bandwidth needed by modern processor technologies, including multi-core technologies.

The memory system 100 may also include a memory fabric control register 117 coupled to the matrix switch 116. The memory fabric control register 117 accepts memory fabric configuration parameters from a configuration source and configures one or more components of the memory system 100 to operate according to a selectable mode. For example, the matrix switch 116 and each of the plurality of memory vaults 102 and the plurality of MVCs 104 may normally be configured to operate independently of each other in response to separate memory requests. Such a configuration may enhance memory system bandwidth as a result of the parallelism between the SCLIs 112 and the memory vaults 102.

Alternatively, the memory system 100 may be reconfigured via the memory fabric control register 117 to cause a subset of two or more of the plurality of memory vaults 102 and a corresponding subset of MVCs to operate synchronously in response to a single request. The latter configuration may be used to access a wider-than-normal data word to decrease latency, as further described below. Other configurations may be enabled by loading a selected bit pattern into the memory fabric control register 117.

Figure 3:
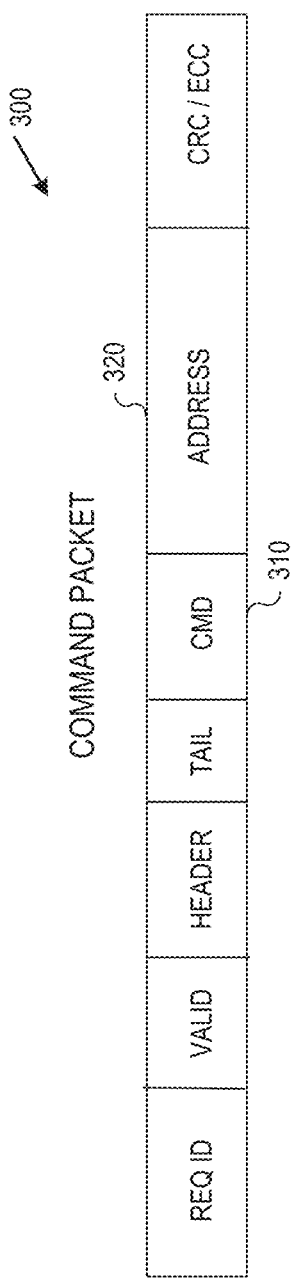
FIGS. 3 and 4 are packet diagrams showing fields associated with example packets according to various example embodiments.
Figure 4:
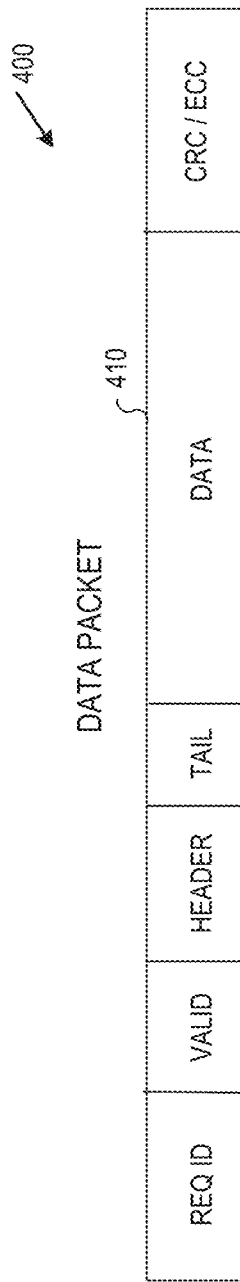

FIGS. 3 and 4 are packet diagrams showing fields associated with example packets 300 and 400, respectively, according to various example embodiments. Turning to FIG. 1 in light of FIGS. 3 and 4, the memory system 100 may also include a plurality of packet decoders 118 (e.g., the packet decoder 120) coupled to the matrix switch 116. The host processor(s) 114 assemble an outbound packet 122 that in some embodiments may be similar in structure to the example packet 300 or 400. That is, the outbound packet 122 may contain a command field 310, an address field 320, and/or a data field 410. The host processor 114 then sends the outbound packet 122 across an outbound SCLI (e.g., the outbound SCLI 114) to the packet decoder 120 in a manner further explained below.

The outbound SCLI 114 may include a plurality of outbound differential pair serial paths (DPSPs) 128. The DPSPs 128 are communicatively coupled to the host processor(s) 114 and may collectively transport the outbound packet 122. That is, each DPSP of the plurality of outbound DPSPs 128 may transport a first data rate outbound sub-packet portion of the outbound packet 122 at a first data rate.

The outbound SCLI 114 may also include a deserializer 130 coupled to the plurality of outbound DPSPs 128. The deserializer 130 converts each first data rate outbound sub-packet portion of the outbound packet 122 to a plurality of second data rate outbound sub-packets. The plurality of second data rate outbound sub-packets is sent across a first plurality of outbound single-ended data paths (SEDPs) 134 at a second data rate. The second data rate is slower than the first data rate.

The outbound SCLI 114 may also include a demultiplexer 138 communicatively coupled to the deserializer 130. The demultiplexer 138 converts each of the plurality of second data rate outbound sub-packets to a plurality of third data rate outbound sub-packets. The plurality of third data rate outbound sub-packets is sent across a second plurality of outbound SEDPs 142 to the packet decoder 120 at a third data rate. The third data rate is slower than the second data rate.

The packet decoder 120 receives the outbound packet 122 and extracts the command field 310 (e.g., of the example packet 300), the address field 320 (e.g., of the example packet 300), and/or the data field (e.g., of the example packet 400). In some embodiments, the packet decoder 120 decodes the address field 320 to determine a corresponding set of memory vault select signals. The packet decoder 120 presents the set of memory vault select signals to the matrix switch 116 on an interface 146. The vault select signals cause the input data paths 148 to be switched to the MVC 106 corresponding to the outbound packet 122.

Turning now to a discussion of the inbound data paths, the memory system 100 may include a plurality of packet encoders 154 (e.g., the packet encoder 158) coupled to the matrix switch 116. The packet encoder 158 may receive an inbound memory command, an inbound memory address, and/or inbound memory data from one of the plurality of MVCs 104 via the matrix switch 116. The packet encoder 158 encodes the inbound memory command, address, and/or data into an inbound packet 160 for transmission across an inbound SCLI 164 to the host processor(s) 114.

In some embodiments, the packet encoder 158 may segment the inbound packet 160 into a plurality of third data rate inbound sub-packets. The packet encoder 158 may send the plurality of third data rate inbound sub-packets across a first plurality of inbound single-ended data paths (SEDPs) 166 at a third data rate. The memory system 100 may also include a multiplexer 168 communicatively coupled to the packet encoder 158. The multiplexer 168 may multiplex each of a plurality of subsets of the third data rate inbound sub-packets into a second data rate inbound sub-packet. The multiplexer 168 sends the second data rate inbound sub-packets across a second plurality of inbound SEDPs 170 at a second data rate that is faster than the third data rate.

The memory system 100 may further include a serializer 172 communicatively coupled to the multiplexer 168. The serializer 172 aggregates each of a plurality of subsets of the second data rate inbound sub-packets into a first data rate inbound sub-packet. The first data rate inbound sub-packets are sent to the host processor(s) 114 across a plurality of inbound differential pair serial paths (DPSPs) 174 at a first data rate that is faster than the second data rate. Command, address, and data information is thus transferred back and forth between the host processor(s) 114 and the MVCs 104 across the SCLIs 112 via the matrix switch 116.

Figure 5:
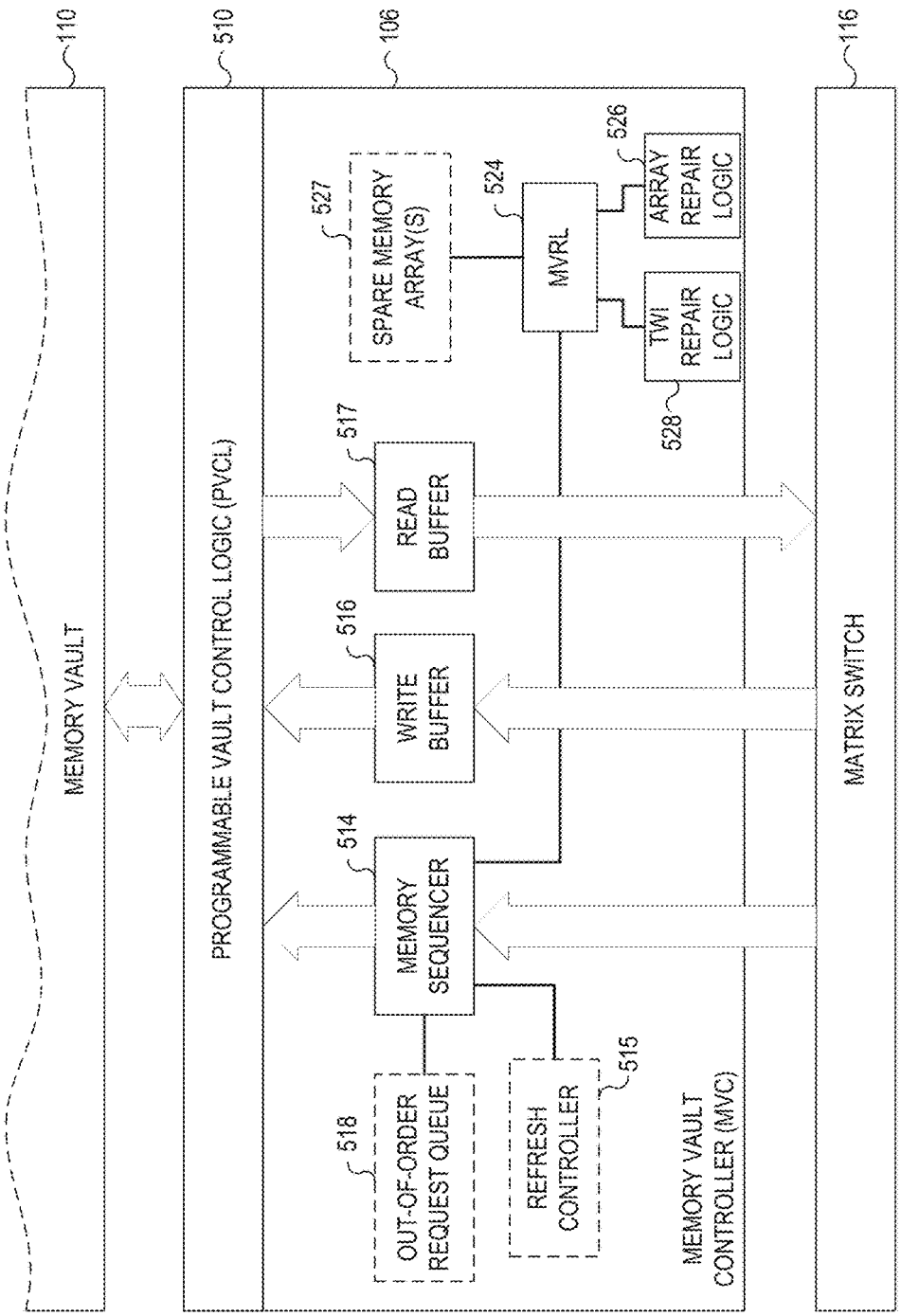
FIG. 5 is a block diagram of a memory vault controller and associated modules according to various example embodiments.

FIG. 5 is a block diagram of an MVC (e.g., the MVC 106) and associated modules according to various example embodiments. The MVC 106 may include a programmable vault control logic (PVCL) component (e.g., the PVCL 510). The PVCL 510 interfaces the MVC 106 to the corresponding memory vault (e.g., the memory vault 110). The PVCL 510 generates one or more bank control signals and/or timing signals associated with the corresponding memory vault 110.

The PVCL 510 may be configured to adapt the MVC 106 to a memory vault 110 of a selected configuration or a selected technology. Thus, for example, the memory system 100 may initially be configured using currently-available DDR2 DRAMs. The memory system 100 may subsequently be adapted to accommodate DDR3-based memory vault technology by reconfiguring the PVCL 510 to include DDR3 bank control and timing logic.

The MVC 106 may also include a memory sequencer 514 communicatively coupled to the PVCL 510. The memory sequencer 514 performs a memory technology dependent set of operations based upon the technology used to implement the associated memory vault 110. The memory sequencer 514 may, for example, perform command decode operations, memory address multiplexing operations, memory address demultiplexing operations, memory refresh operations, memory vault training operations, and/or memory vault prefetch operations associated with the corresponding memory vault 110. In some embodiments, the memory sequencer 514 may comprise a DRAM sequencer. In some embodiments, memory refresh operations may originate in a refresh controller 515.

The memory sequencer 514 may be configured to adapt the memory system 100 to a memory vault 110 of a selected configuration or technology. For example, the memory sequencer 514 may be configured to operate synchronously with other memory sequencers associated with the memory system 100. Such a configuration may be used to deliver a wide data word from multiple memory vaults to a cache line (not shown) associated with the host processor(s) 114 in response to a single cache line request.

The MVC 106 may include a write buffer 516. The write buffer 516 may be coupled to the PVCL 510 to buffer data arriving at the MVC 106 from the host processor(s) 114. The MVC 106 may further include a read buffer 517. The read buffer 517 may be coupled to the PVCL 510 to buffer data arriving at the MVC 106 from the corresponding memory vault 110.

The MVC 106 may also include an out-of-order request queue 518. The out-of-order request queue 518 establishes an ordered sequence of read and/or write operations to the plurality of memory banks included in the memory vault 110. The ordered sequence is chosen to avoid sequential operations to any single memory bank, such as in order to reduce bank conflicts and to decrease read-to-write turn-around time.

The MVC 106 may further include a memory vault repair logic (MVRL) component 524. The MVRL 524 may be coupled to the memory vault 110 to perform defective memory array address remapping operations using array repair logic 526. The MVRL 524 may also perform TWI repair operations associated with the memory vault 110 using TWI repair logic 528.

Figure 5A:
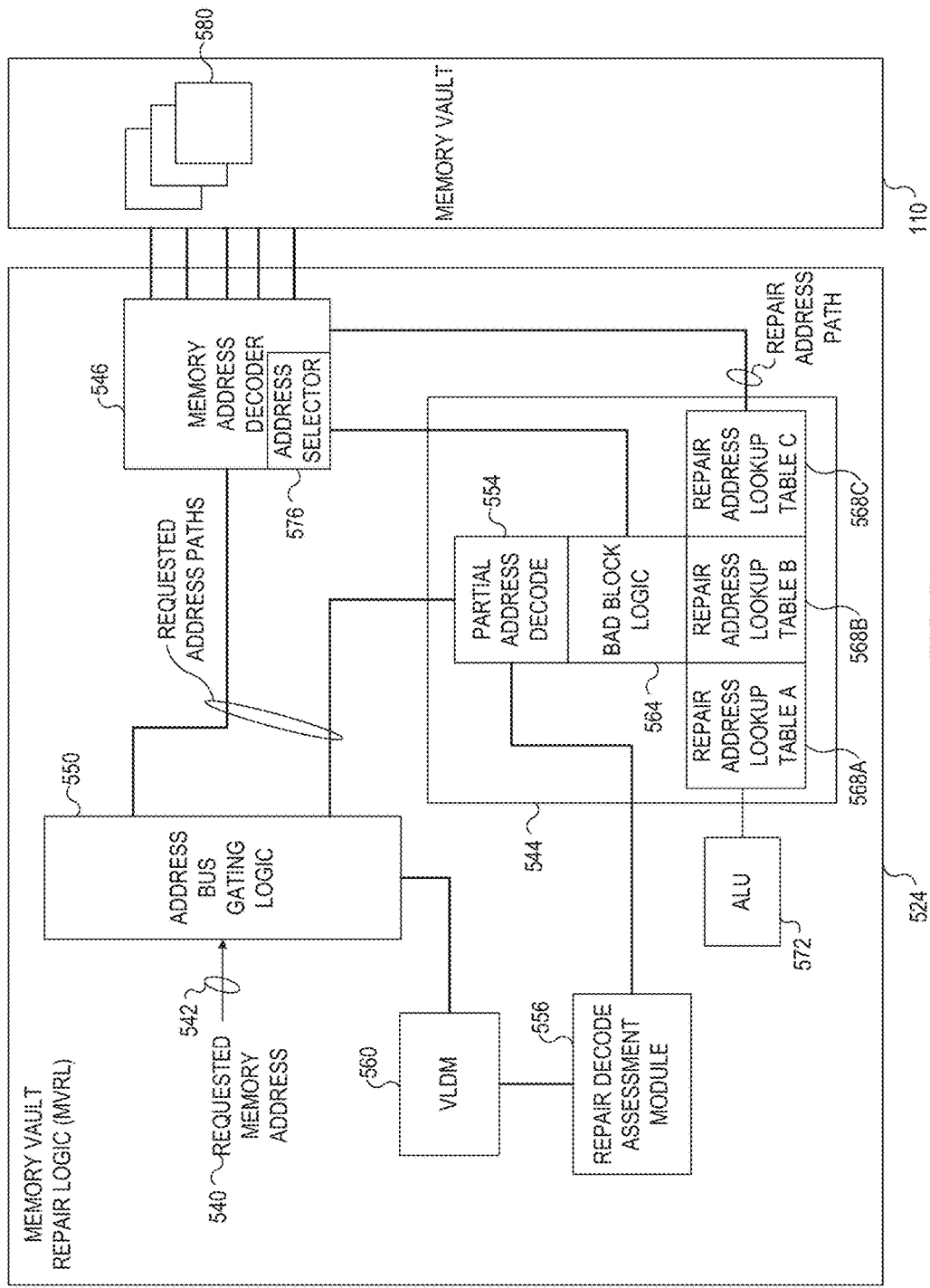
FIG. 5A is a block diagram of a memory vault repair logic component of a memory vault controller according to various example embodiments.

FIG. 5A is a block diagram of the MVRL 524 according to various example embodiments. The MVRL 524 remaps memory requests which reference defective memory cells. The memory requests to defective cells are remapped to reference redundant cells or arrays of cells located on dies associated with the memory vault 110 (e.g., on the stacked die 204 of FIG. 2) and/or on the logic die 202 of FIG. 2 (e.g., the spare array 527 of FIG. 5).

In some embodiments, the MVRL 524 foray operate according to a variable latency decode scheme. The MVRL 524 may receive a memory request including a requested memory address 540 on a path 542. The MVRL 524 may send the memory request to repair address logic 544 to determine whether the requested memory address 540 references a defective memory location. If it is determined that the requested memory address 540 does reference a defective memory location, a modified memory request referencing a spare memory array may be used instead of the requested memory address.

In some embodiments, the MVRL 524 may also send the requested memory address 540 to a memory address decoder 546 without waiting to determine whether the requested memory address 540 references a defective memory location. The address decoder 546 may begin decoding the requested address 540 while a repair address assessment is being made. By the time the repair address assessment determines whether the requested address 540 references healthy memory cells, the address decoder may have progressed with decoding the requested address 540. Latency may be reduced as a result, in cases where the requested memory address 540 references a healthy memory location. Average latency may be reduced because the number of memory requests referencing defective memory locations is likely to be smaller than the number of memory requests referencing healthy memory locations.

The MVRL 524 may include address bus gating logic 550 coupled to the path 542. The address bus gating logic 550 passes the requested memory address 540 to the memory address decoder 546 and/or to a partial address decoder 554 coupled to the address bus gating logic 550. The partial address decoder 554 partially decodes the requested memory address 540. A repair decode assessment module 556 may be coupled to the partial address decoder 554. The repair decode assessment module 556 estimates the latency associated with determining whether the requested memory address 540 references a defective memory location and, if so, with performing a lookup of the repair address.

The MVRL 524 may also include a variable latency decision module (VLDM) 560 coupled to the repair decode assessment module 556. The VLDM 560 causes the address bus gating logic 550 to pass the memory request including the requested memory address 540 to the memory address decoder 546 if the estimated latency is greater than a selected amount. Thus, the partial address decoder 554, the repair decode assessment module 556, and the VLDM 560 form a feedback loop. The feedback loop operates to determine whether the requested memory address 540 is launched to the memory address decoder 546 before knowing whether the requested memory address 540 references a healthy memory location ("early launch").

An early launch may be a particularly effective strategy if it can be quickly determined that, for a particular requested memory address 540, a large latency is likely to be associated with the repair address lookup process. If the requested memory address 540 is found to reference a healthy memory location, the memory address decode process will have advanced while repair address assessment and lookup operations are being performed.

The MVRL 524 may also include bad block logic 564 coupled to the partial address decoder 554. In some embodiments, the bad block logic 564 selects an appropriate repair address lookup scheme from several available schemes. The repair address lookup scheme may be selected based upon the number of bad blocks in a particular die or bank. The repair address lookup scheme may also be selected based upon the number of memory words in a bad block addressed by the requested memory address 540 as determined by the partial address decoder 554 operating in conjunction with the bad block logic 564.

The MRL 524 may thus include one or more repair address lookup tables (e.g., the example repair address lookup tables 568A, 568B, and 568C) communicatively coupled to the bad block logic 564. The selected repair address lookup table 568A, 568B, or 568C translates the requested memory address 540 to the repair address. The repair address lookup tables 568A, 568B, 568C may include direct-mapped tables, fully associative tag random-access memory (RAM), and/or set associative tag RAM.

In some embodiments, the repair address lookup table 568A, 568B, or 568C may store an address offset as the repair address. Addresses associated with an entire block of defective memory locations may be mapped to a block of repair addresses beginning at a base address pointing to the start of a repair memory array. In some embodiments, an arithmetic/logic unit (ALU) 572 may calculate the repair address using the address offset.

The repair address lookup table 568A, 568B, 568C sends the repair address to the memory address decoder 546. However, the requested memory address 540 may have already been passed to the memory address decoder 546 at an earlier time, before a determination was made whether the requested memory address 540 referenced a defective memory location. In the latter case, decoding of the requested memory address 540 should not be allowed to proceed.

The bad block logic 564 may be coupled to an address selector component 576 of the memory address decoder 546. The address selector component 576 rejects the partially decoded requested memory address and initiates decoding of the repair address if the requested memory address is determined to reference a defective memory cell. Otherwise, the address selector 576 allows completion of the decoding of the requested memory address 540. The memory address decoder 546 decodes the requested memory address 540 or the repair address, as applicable, into a memory die identifier, a memory bank identifier, a row address, and/or a column address and sends these address components to the memory vault 110 to access the corresponding memory locations.

The repair address may reference memory cells in a spare memory array located on a spare memory die 580. The spare memory die 580 may be stacked with other memory array dies as a repair component of the memory vault 110. Alternatively, the repair address may reference a spare memory array fabricated on a logic die common with the MVRL 524 (e.g., the spare memory array 527 of FIG. 5). The spare memory array may be fabricated as a SRAM, a DRAM, or any other semiconductor memory technology.

Any of the components previously described may be implemented in a number of ways, including embodiments in hardware, software, firmware, or combinations thereof. It is noted that "software" in this context refers to statutory software structures and not to mere software listings.

Thus, the memory system 100; the memory arrays 200, 203, 240, 527; the die 202, 204; the tiles 205A, 205B, 205C, 208, 212B, 212C, 212D; the "Z" dimension 220; the paths 224, 148, 542; the memory vaults 230, 102, 110; the MVCs 104, 106; the SCLIs 112, 113, 114, 115, 164; the processor(s) 114; the matrix switch 116; the register 117; the packets 300, 400, 122, 160; the packet decoders 118, 120; the fields 310, 320, 410; the DPSPs 128, 174; the deserializer 130; the SEDPs 134, 142, 166, 170; the demultiplexer 138; the interface 146; the packet encoders 154, 158; the multiplexer 168; the serializer 172; the PVCL 510; the memory sequencer 514; the refresh controller 515; the buffers 516, 517; the out-of-order request queue 518; the MVRL: 524; the array repair logic 526; the TWI repair logic 528; the memory address 540; the repair address logic 544; the memory address decoder 546; the address bus gating logic 550; the partial address decoder 554; the repair decode assessment module 556; the VLDM 560; the bad block logic 564; the repair address lookup tables 568A, 568B, 568C; the ALU 572; the address selector 576; and the spare memory die 580 may all be characterized as "modules" herein.

The modules may include hardware circuitry, optical components, single or multi-processor circuits, memory circuits, software program modules and objects (but not software listings), firmware, and combinations thereof, as desired by the architect of the memory system 100 and as appropriate for particular implementations of various embodiments.

The apparatus and systems of various embodiments may be useful in applications other than a high-density, multi-link, high-throughput semiconductor memory subsystem with an included MVRL 524. Thus, various embodiments of the invention are not to be so limited. The illustrations of the memory system 100 and the MVRL 524 are intended to provide a general understanding of the structure of various embodiments. They are not intended to serve as a complete description of all the elements and features of apparatus and systems that might make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc. set top boxes, and others. Some embodiments may include a number of methods.

Figure 6A:
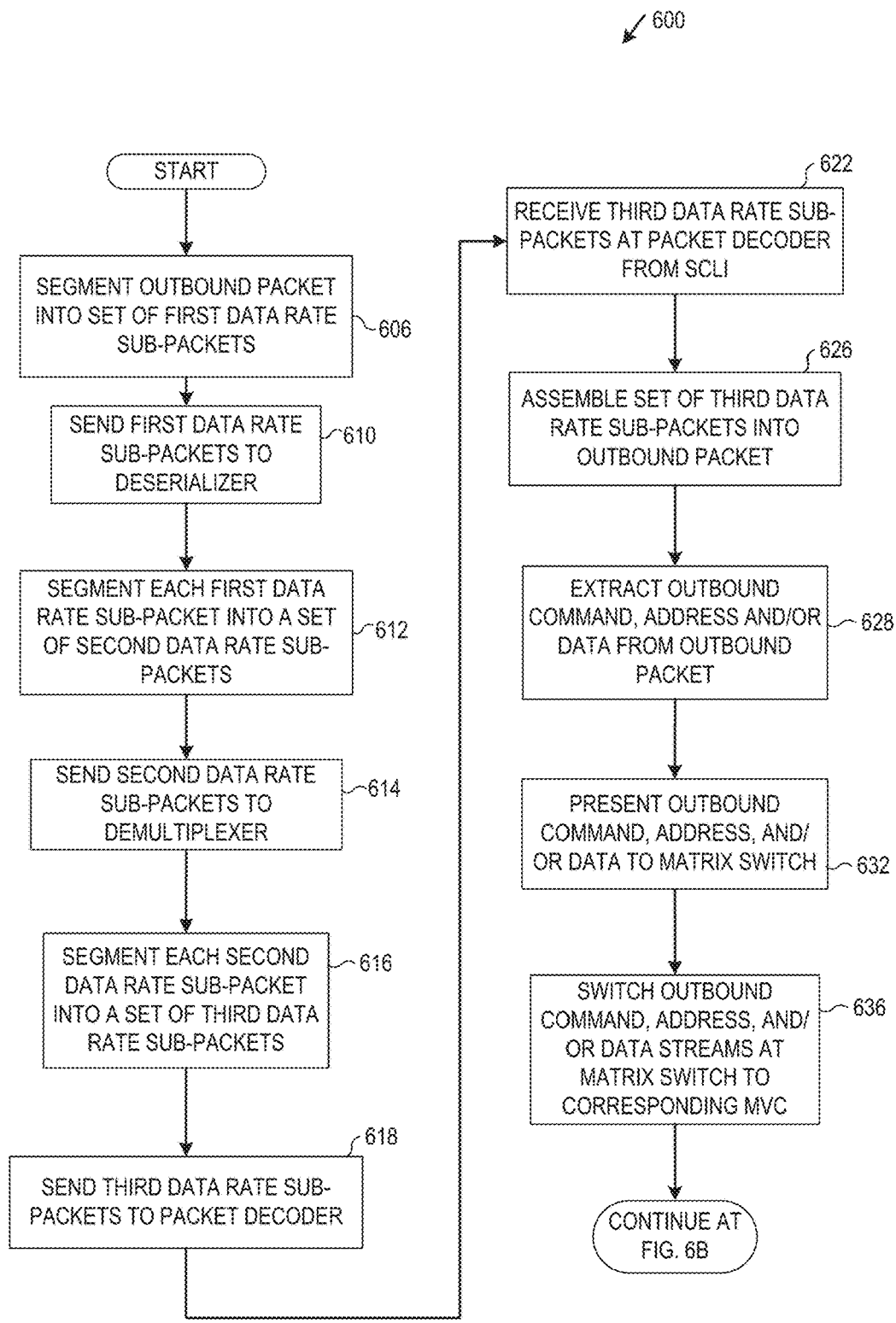
FIGS. 6A and 6B are flow diagrams illustrating a method according to various example embodiments.
Figure 6B:
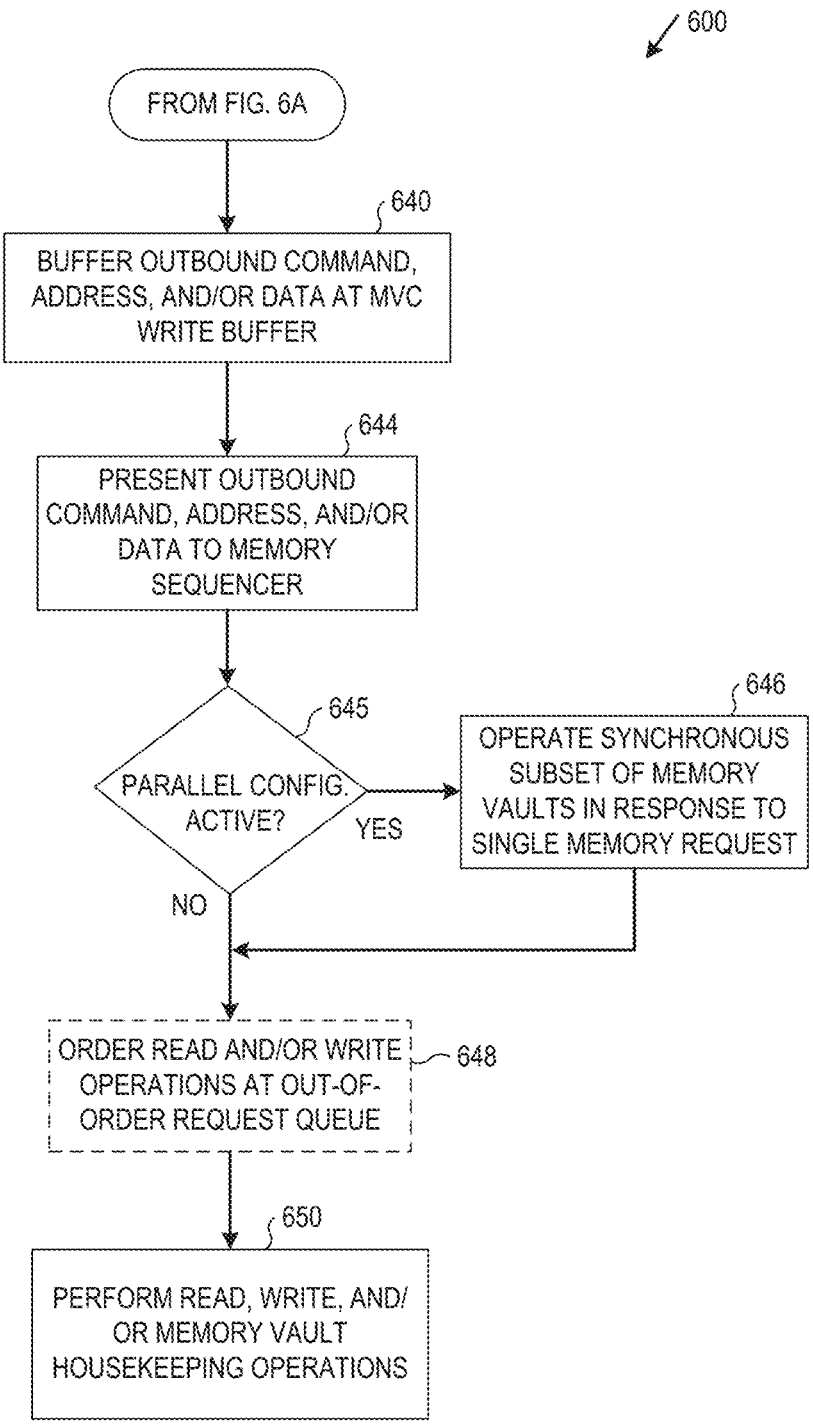

FIGS. 6A and 6B are flow diagrams illustrating a method 600 according to various example embodiments. The method 600 includes substantially concurrently transferring a plurality of outbound streams of commands, addresses, and/or data between one or more originating devices (e.g., the processor(s) 114 of FIG. 1) and a plurality of memory vaults (e.g., the memory vaults 102 of FIG. 1). The streams may be packetized and transported from the originating device(s) across a plurality of outbound SCLIs (e.g., the outbound SCLIs 113 of FIG. 1) to a set of packet decoders (e.g., the packet decoders 118 of FIG. 1). The command, address, and data streams may then be switched to corresponding MVCs (e.g., the MVCs 104) for execution and/or writing to or reading from the memory vaults.

The method 600 may commence at block 606 with segmenting an outbound packet into a set of first data rate sub-packet portions at the originating device. In some embodiments, the originating device may include one or more processors. In some embodiments, the originating device may include a category of devices capable of direct memory access (DMA) such as a graphics controller. The packet may carry one or more outbound memory subsystem commands, addresses, or data fields to be written to one or more memory subsystem locations.

The method 600 may continue at block 610 with sending each of the first data rate sub-packets from the originating device (e.g., from a selected processor) to a deserializer (e.g., the deserializer 130 of FIG. 1). The first data rate sub-packets may be sent across a plurality of DPSPs (e.g., the DPSPs 128 of FIG. 1) corresponding to a selected outbound SCLI (e.g., the outbound SCLI 114 of FIG. 1) at a first data rate. The method 600 may also include segmenting each of the first data rate sub-packets into a plurality of second data rate sub-packets at the deserializer, at block 612.

The method 600 may further include sending each of the second data rate sub-packets from the deserializer to a demultiplexer (e.g., the demultiplexer 138 of FIG. 1) at a second data rate slower than the first data rate, at block 614. At the demultiplexer, each of the second data rate sub-packets may be segmented into a set of third data rate sub-packets, as depicted at block 616. The method 600 may also include sending the third data rate sub-packets to a packet decoder at a third data rate slower than the second data rate, at block 618.

The method 600 may continue at block 622 with receiving the third data rate sub-packets at the packet decoder from the selected SCLI. The method 600 may include assembling the set of third data rate sub-packets into the outbound packet, at block 626. The method 600 may also include extracting at least one of the outbound command, the outbound address, or the outbound data from the packet, at block 628.

The method 600 may also include presenting the outbound command, address, or data to the matrix switch, at block 632. The method 600 may further include concurrently switching an outbound command, address, and/or data associated with each stream at the matrix switch, at block 636. The outbound command, address, and/or data associated with each stream is switched to a destination MVC (e.g., the MVC 106 of FIG. 1) associated with a corresponding memory vault (e.g., the memory vault 110 of FIG. 1).

The method 600 may continue at block 640 with buffering the outbound command, address, and/or data at a write buffer component of the MVC (e.g., the write buffer 516 of FIG. 1). The method 600 may include presenting the outbound command, address, and/or data to a memory sequencer (e.g., the memory sequencer 514 of FIG. 1) for processing, at block 644.

In some embodiments, the method 600 may optionally include determining whether the memory subsystem has been configured to operate in a synchronous parallel mode, at block 645. If so, the method 600 may include operating a synchronous subset of the memory vaults in response to a single memory request, at block 646. Such operation may be used to decrease access latency by synchronously transferring a wide data word of a width that is a multiple of a single memory vault word length. The resulting wide data word width corresponds to the number of memory vaults in the synchronous subset of vaults.

The method 600 may optionally include ordering read and/or write operations to a plurality of memory banks associated with a corresponding memory vault at an out-of-order request queue component of the memory sequencer (e.g., the out-of-order request queue 518 of FIG. 5), at block 648. The ordering may operate to avoid multiple sequential reads and/or writes to any single memory bank and may thereby reduce bank conflicts and decrease read-to-write turnaround times.

The method 600 may conclude at block 650 with performing data write operations to write the outbound data to the corresponding memory vault, data, read operations to read data from the corresponding memory vault, and/or memory vault housekeeping operations. The data write operations, data read operations, and/or housekeeping operations may be performed independently from concurrent operations associated with other MVCs coupled to other memory vaults.

Figure 7A:
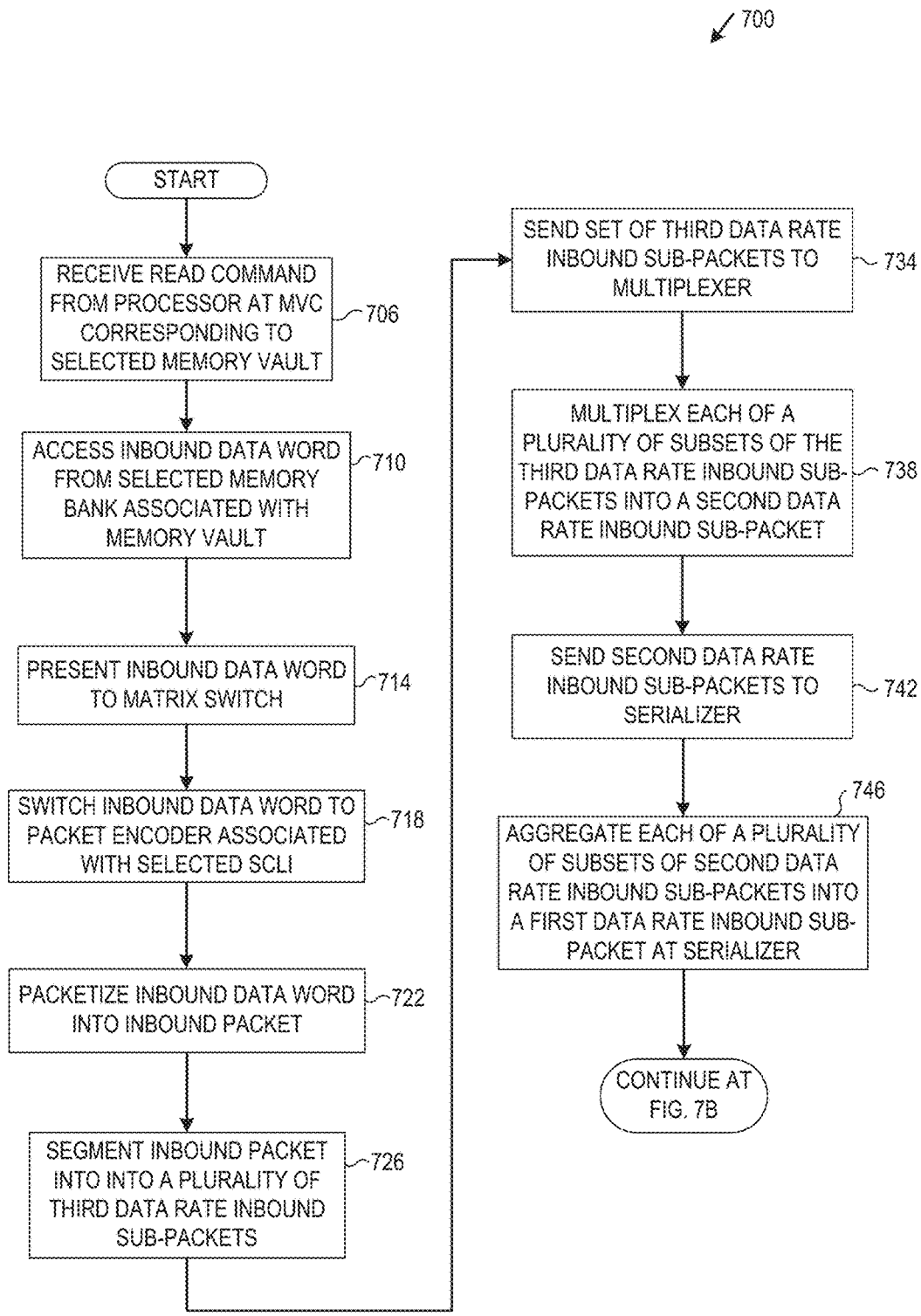
FIGS. 7A and 7B are flow diagrams illustrating a method according to various example embodiments.
Figure 7B:
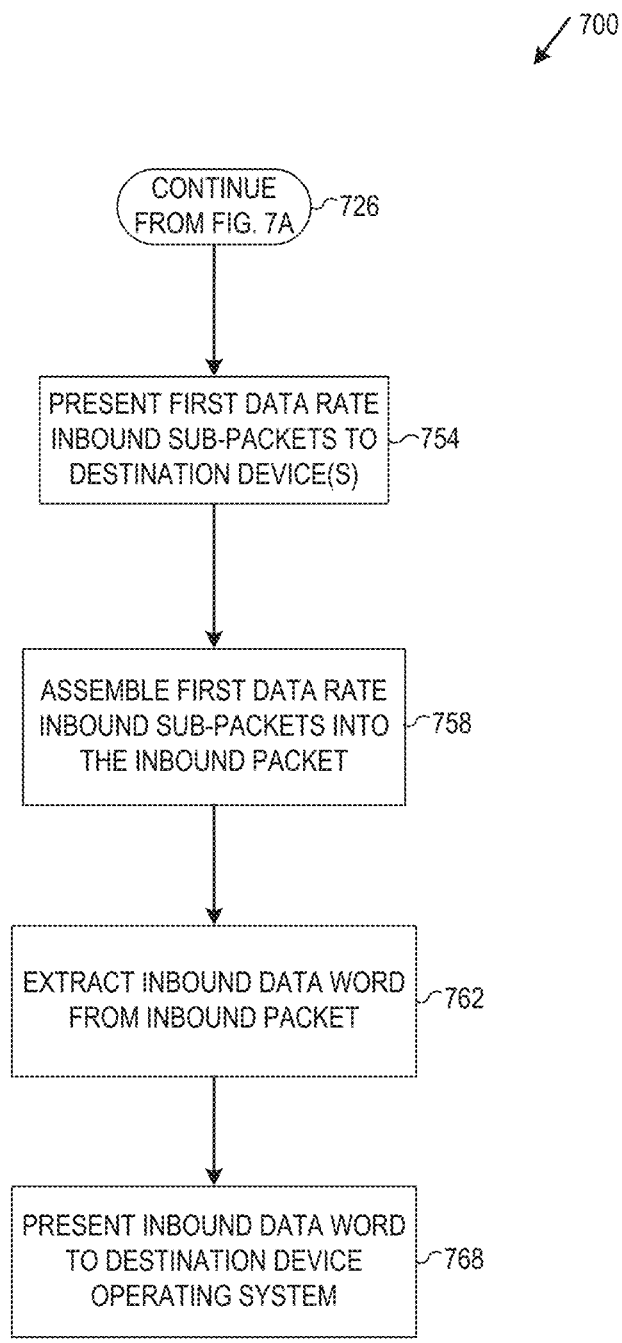

FIGS. 7A and 7B are flow diagrams illustrating a method 700 according to various example embodiments. The method 700 includes substantially concurrently transferring a plurality of inbound streams of packetized commands, addresses, and/or data between a plurality of memory vaults (e.g., the memory vaults 102 of FIG. 1) and one or more destination devices (e.g., the processor(s) 114 of FIG. 1). The command, address, and/or data streams may be read from the memory vaults by a set of MVCs associated with the memory vaults (e.g., the MVCs 104 of FIG. 1) and/or may originate at the MVCs. The streams may be switched through a matrix switch (e.g., the matrix switch 116 of FIG. 1) to a set of packet encoders (e.g., the packet encoders 154 of FIG. 1). The streams may then be packetized and transported to the destination device(s) across a plurality of inbound SCLIs (e.g., the inbound SCLIs 115 of FIG. 1).

The method 700 may commence at block 706 with receiving a read command from a processor at an MVC (e.g., the MVC 106 of FIG. 1) corresponding to a selected memory vault (e.g., the memory vault 110 of FIG. 1). It is noted that in some embodiments, the processor and the destination device may be the same device; however this need not be the case. The method 700 may continue at block 710 with accessing an inbound data word from a selected memory bank associated with the memory vault using a memory sequencer (e.g., the memory sequencer 514 of FIG. 1) associated with the MVC. The method 700 may include presenting the inbound data word to the matrix switch, at block 714.

The method 700 may also include switching the inbound data word to a packet encoder (e.g., the packet encoder 158 of FIG. 1) associated with a selected SCLI (e.g., the inbound SCLI 164) using the matrix switch, at block 718. The method 700 may further include packetizing the inbound data word into an inbound packet using the packet encoder, at block 722.

The method 700 may continue at block 726 with segmenting the inbound packet into a plurality of third data rate inbound sub-packets. The method 700 may include sending the plurality of third data rate inbound sub-packets to a multiplexer (e.g., the multiplexer 168 of FIG. 1) at a third data rate, at block 734. The method 700 may also include multiplexing each of a plurality of subsets of the third data rate inbound sub-packets into a second data inbound sub-packet using the multiplexer, at block 738. The method 700 may further include sending the second data rate inbound sub-packets to a serializer (e.g., the serializer 172 of FIG. 1) at a second data rate, at block 742.

The method 700 may continue at block 746 with aggregating each of a plurality of subsets of the second data rate inbound sub-packets into a first data rate inbound sub-packet using the serializer. The method 700 may include presenting the first data rate inbound sub-packets to the destination device(s), at block 754. The method 700 may also include assembling e first data rate inbound sub-packets into the inbound packet, at block 758. The method 700 may conclude with extracting the inbound data word from the inbound packet, at block 762, and presenting the inbound data word to an operating system associated with the destination device(s), at block 768.

Figure 8:
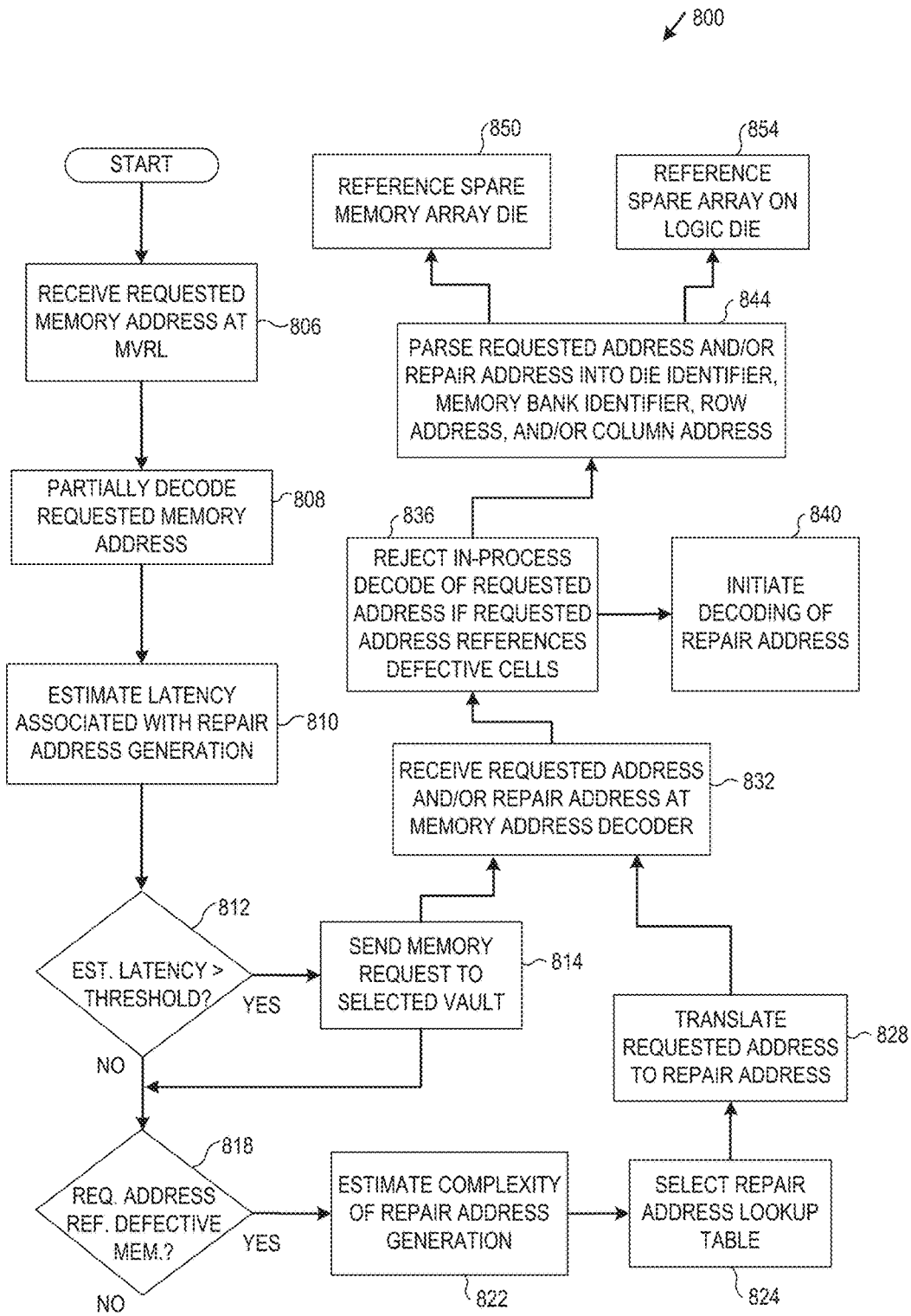
FIG. 8 is a flow diagram illustrating a method according to various example embodiments.

FIG. 8 is a flow diagram illustrating a method 800 according to various example embodiments. The method 800 includes remapping memory requests which reference defective memory cells. Memory requests to defective cells are remapped to reference redundant cells or arrays of cells located on dies associated with a selected memory vault (e.g., on the stacked die 204 of FIG. 2) and/or on the logic die stacked with the memory vault dies (e.g., the spare array 527 of FIG. 5 located on the logic die 202 of FIG. 2).

The method 800 may commence at block 806 with receiving a memory request including a requested memory address at an MVRL module. The method 800 may continue at block 808 with partially decoding the requested memory address. The method 800 may also include estimating a latency associated with translating the requested memory address to the repair address to derive an estimated latency, at block 810. The method 800 may further include comparing the estimated latency to a threshold latency value, at block 812. The method 800 may include sending the memory request including the requested memory address to the selected vault if the estimated latency is greater than a selected amount, at block 814.

The method 800 may continue at block 818 with determining whether the requested memory address references one or more defective memory cells. If so, the method 800 may also include estimating a complexity of repair address generation, at block 822. The method 800 may further include selecting one of several repair address lookup tables, at block 824. Available types of repair address lookup tables may include direct-mapped tables, fully associative tag RAM, or set associative tag RAM, among others.

Some types of repair address lookup tables may be more efficient than others depending upon the complexity of repair address generation. The complexity of repair address generation may depend upon the number of defective address locations in a given memory bank and the layout and density of available replacement memory locations, among other factors. For example, if a complete spare memory array die were available in a memory vault die stack, some embodiments might generate the repair address by simply substituting a die address of the spare memory array die into the requested memory address. The method 800 may thus include translating the requested memory address to the repair address using the selected repair address lookup table, at block 828.

The method 800 may continue at block 832 with receiving the requested memory address, the repair address, or both at the memory address decoder. The method 800 may also include rejecting an in-process requested memory address decode operation at the memory address decoder if the requested memory address is determined to reference one or more defective memory cells, at block 836. In the latter case, the method 800 may include initiating decoding of the repair address, at block 840.

The method 800 may continue at block 844 with decoding the requested memory address or the repair address into a memory die identifier, a memory bank identifier, a row address, or a column address. The method 800 may conclude at block 850 with referencing a spare memory die component of the memory vault using the repair address, at block 850. Alternatively, the method 800 may conclude with referencing one or more spare memory arrays fabricated on a logic die that is common with the MVRL (e.g., the logic die 202 of FIG. 2) using the repair address, at block 854.

Figure 9:
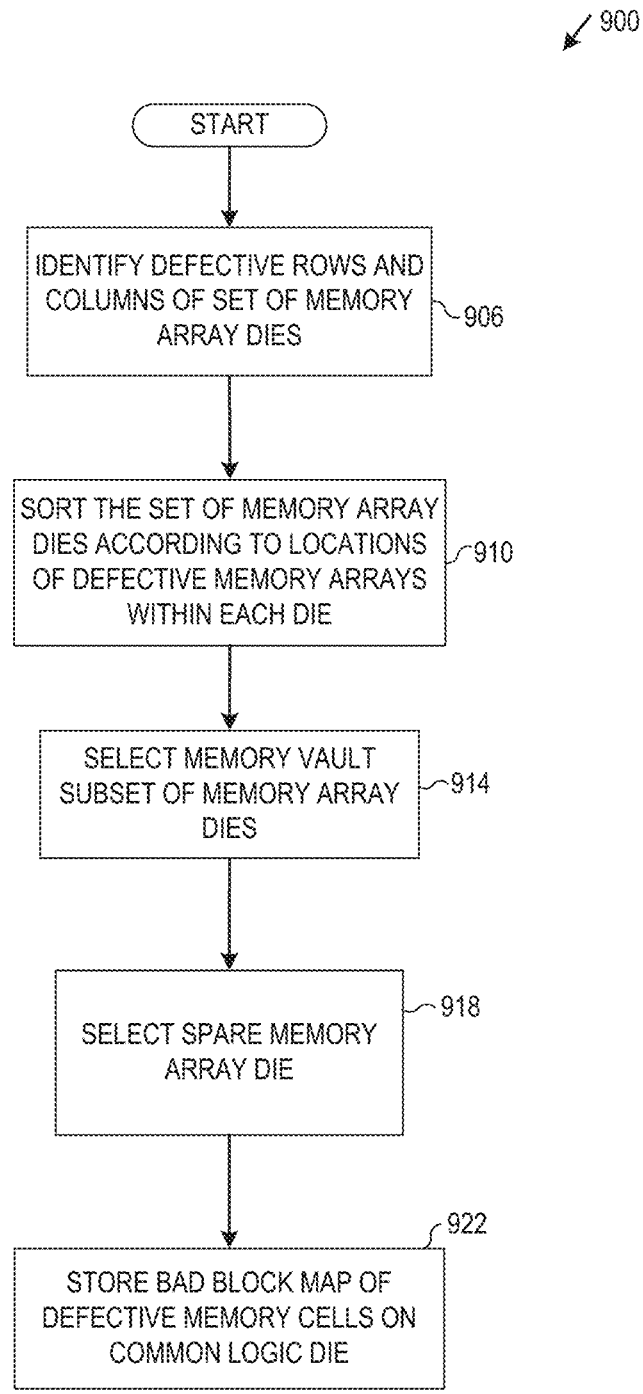
FIG. 9 is a flow diagram illustrating a method according to various example embodiments.

FIG. 9 is a flow diagram illustrating a method 900 according to various example embodiments. The method 900 operates to select and categorize memory array dies during manufacturing of a stacked-array memory vault to facilitate bad block mapping and repair operations.

The method 900 may commence at block 906 with identifying defective rows and columns associated with one or more memory arrays on each of a set of memory array dies during manufacturing. The method 900 may continue at block 910 with sorting the set of memory array dies according to the locations of the defective memory arrays within each die to obtain a sorted set of memory array dies.

The method 900 may also include selecting a "memory vault" subset of memory array dies from the sorted set, at block 914. The memory vault subset of dies is selected to he stacked to form a plurality of memory vaults (e.g., the stacked-die memory array 200 of FIG. 2). The memory vault subset may be selected to avoid overlap of addresses associated with contiguous areas of defective memory cells on dies from the memory vault set with addresses associated with contiguous areas of defective memory cells on any other die from the memory vault set.

The method 900 may further include selecting a spare memory array die, at block 918. The spare die may be selected such that one or more contiguous areas of operational memory cells on the spare memory array die are located at a starting memory address in common with a second contiguous area of operational memory cells on one or more of the memory vault subset of memory array dies. The starting memory address may include a bank address, a row address, and/or a column address.

The method 900 may also include storing a bad block map of defective memory cells associated with each of the memory vault set of memory dies on a common logic (lie stacked together with the memory vault set of memory array dies, at block 922.

It is noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as lava or C++. Alternatively, the programs may be structured in a procedure-oriented format using a procedural language, such as assembly or C. The software components may communicate using well-known mechanisms, including application program interfaces, inter-process communication techniques, and remote procedure calls, among others. The teachings of various embodiments are not d to any particular programming language or environment.

The apparatus, systems, and methods described herein may operate to perform defective memory array repair of a stacked-die memory vault using variable latency address decode and selective repair address lookup techniques. Average memory access latencies may be decreased as a result.

By way of illustration and not of limitation, the accompanying figures show specific embodiments in which the subject matter may be practiced. The embodiments illustrated are described in sufficient detail to enable those skilled, in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. § 1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method, comprising:
   receiving, at a memory vault repair logic (MVRL) of a memory vault controller (MVC), a memory request including a requested memory address;
   translating the requested memory address into a repair address; and
   sending one or both of the memory request and the repair address to a memory vault communicatively coupled to the MVC, wherein the memory vault includes a stacked plurality of memory arrays, each memory array of the stacked plurality of memory arrays located on a memory die of a plurality of stacked memory dies.

2. The method of claim 1, further comprising:
   Estimating, at the MVC, a latency associated with translating the requested memory address into the repair address.

3. The method of claim 2, further comprising:
   causing, at the MVC, the memory request including the requested memory address to be passed to a memory address decoder if the estimated latency is greater than a selected amount.

4. The method of claim 1, wherein the memory vault includes a spare memory die.

5. The method of claim 1, wherein the MVC includes a spare memory array.

6. The method of claim 5, wherein the spare memory array includes one or both of a static random-access memory (SRAM) and a dynamic random-access memory (DRAM).

7. The method of claim 1, further comprising:
   performing, at the MVC, memory sequencing operations.

8. The method of claim 1, further comprising:
   performing, at the MVC, data buffering operations.

9. The method of claim 1, further comprising:
   performing, at the MVC, memory array repair operations.

10. A method, comprising:
    receiving, at a memory vault repair logic (MVRL) of a memory vault controller (MVC), a memory request including a requested memory address;
    sending one or both the memory request and a modified memory request from the MVRL to a memory vault communicatively coupled to the MVC, the modified memory request including a repair address;
    partially decoding, at the MVRL, the requested memory address;
    translating, using a repair address lookup table of the MVRL, the requested memory address into the repair address; and
    selecting, at the MVRL, the repair address lookup table from a plurality of repair address lookup tables.

11. The method of claim 10, wherein the plurality of repair address lookup tables includes a direct-mapped table.

12. The method of claim 10, wherein the plurality of repair address lookup tables includes a fully associative tag random-access memory.

13. The method of claim 10, wherein the plurality of repair address lookup tables includes a set associative tag random-access memory.

14. The method of claim 10, further comprising:
    Estimating, at the MVRL, a latency associated with translating the requested memory address into the repair address.

15. The method of claim 10, further comprising:
    calculating, at the MVRL, the repair address using an address offset stored in the repair address lookup table as an entry associated with the requested memory address.

16. A method comprising:
    receiving, at a memory vault repair logic (MVRL) of a memory vault controller (MVC), a memory request including a requested memory address;
    sending one or both of the memory request and the repair address to a memory vault communicatively coupled to the MVC;
    partially decoding, at the MVC, the requested memory address;
    translating, using a repair address lookup table at the MVC, the requested memory address into the repair address;
    selecting, at the MVC, the repair address lookup table from a plurality of repair address lookup tables; and
    determining, at the MVC, whether the requested memory address references a non-defective memory location.

17. The method of claim 16, further comprising:
selecting, at the MVC, the repair address lookup table based upon a number of bad blocks.

18. The method of claim 16, further comprising:
selecting, at the MVC, the repair address lookup table based upon a number of words in a bad block as determined by the MVC.

19. The method of claim 16, further comprising:
passing the requested memory address from an address bus gating logic of the MVC to one or both of a memory address decoder of the MVC and a partial address decoder of the MVC.

20. The method of claim 19, further comprising:
rejecting, at the memory address decoder, a partially decoded requested memory address; and
initiating, at the memory address decoder, a decoding of the repair address if the requested memory address is determined to reference at least one defective memory cell.

\* \* \* \* \*